(12) United States Patent
Oh et al.

(10) Patent No.: US 6,847,559 B2
(45) Date of Patent: Jan. 25, 2005

(54) INPUT BUFFER CIRCUIT OF A SYNCHRONOUS SEMICONDUCTOR MEMORY DEVICE

(75) Inventors: Reum Oh, Seoul (KR); Woo-Seop Jeong, Yongin (KR); Kyu-Hyoun Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 23 days.

(21) Appl. No.: 10/611,255

(22) Filed: Jul. 1, 2003

(65) Prior Publication Data

US 2004/0027862 A1 Feb. 12, 2004

(30) Foreign Application Priority Data

Aug. 8, 2002 (KR) ................. 10-2002-0046925

(51) Int. Cl.[7] ................................ G11C 7/00
(52) U.S. Cl. ................. 365/189.05; 365/222
(58) Field of Search .......... 365/189.05, 222, 365/227

(56) References Cited

U.S. PATENT DOCUMENTS

| | | | | |
|---|---|---|---|---|
| 6,058,063 A | * | 5/2000 | Jang | 365/227 |
| 6,115,322 A | * | 9/2000 | Kanda et al. | 365/233 |
| 6,198,689 B1 | * | 3/2001 | Yamazaki et al. | 365/233 |
| 6,330,679 B1 | * | 12/2001 | Conary et al. | 713/300 |
| 6,433,607 B2 | * | 8/2002 | Kawasaki et al. | 327/299 |
| 6,771,108 B2 | * | 8/2004 | Kawasaki et al. | 327/299 |

* cited by examiner

*Primary Examiner*—Tan T. Nguyen
(74) *Attorney, Agent, or Firm*—Mills & Onello, LLP

(57) ABSTRACT

The present invention discloses an input buffer circuit of a synchronous semiconductor memory device comprising a differential amplifier type input buffer and a low current type input buffer, wherein the differential amplifier type input buffer is operated in a normal mode, and the low current type input buffer is operated in a self-refresh mode, thereby decreasing the current flowing through the input buffer in the self-refresh mode. According to the input buffer of the synchronous semiconductor memory device, the current flowing through the input buffer in the self-refresh mode is very small, therefore the power consumption of the synchronous semiconductor memory device can be reduced.

7 Claims, 10 Drawing Sheets

INPUT BUFFER CIRCUIT OF A SYNCHRONOUS SEMICONDUCTOR MEMORY DEVICE

BACKGROUND OF THE INVENTION

1. Field of the Invention

The present invention relates to an input buffer circuit of a synchronous semiconductor memory device, and more particularly to an input buffer circuit of the semiconductor memory device capable of reducing the current flowing into the input buffer circuit in a self-refresh mode.

2. Description of Related Art

A differential amplifier type input buffer has been used as the input buffer of synchronous semiconductor memory devices such as a Double Data Rate Synchronous Dynamic Random Access Memory (DDR SDRAM). When the synchronous semiconductor memory device is in the on state, the current flowing into the differential amplifier type input buffer is more than 200 μA. When the synchronous semiconductor memory device is in the self-refresh mode, the total current of the DDR SDRAM is about 2 mA. As a result, the current flowing into the input buffer in the self-refresh mode takes a large portion of the total current of DDR SRAM.

A conventional synchronous semiconductor memory device used the differential amplifier type input buffer in the self-refresh mode as in the normal mode. Therefore, the power consumption of the device was large.

SUMMARY OF THE INVENTION

An object of the present invention is to provide the input buffer circuit of a synchronous semiconductor memory device, capable of reducing the current flowing into the input buffer in the self-refresh mode.

In one aspect, the input buffer circuit of a synchronous semiconductor memory device according to the invention includes a differential amplifier type input buffer and a low current type input buffer. The differential amplifier type input buffer is operated in a normal mode. The low current type input buffer is operated in a self-refresh mode, thereby reducing the current flowing through the input buffer in the self-refresh mode.

In another aspect the input buffer of the synchronous semiconductor memory device according to the present invention includes a first input buffer circuit that receives an external clock enable signal and a self-refresh control signal to amplify a voltage difference between the received external clock enable signal and a first reference voltage. A delay circuit receives the self-refresh control signal to output the delayed self-refresh control signal. A second input buffer receives the external clock enable signal and the delayed self-refresh control signal to amplify a voltage difference between the received external clock enable signal and a second reference voltage. An OR circuit receives the output signal of the first input buffer and the output signal of the second input buffer and then performs an OR operation to output an internal clock enable signal. The first input buffer is operated in the normal mode and the second input buffer is operated in the self-refresh mode to decrease the current flowing into the input buffer in the self-refresh mode. The first input buffer is a differential amplifier type input buffer and the second input buffer is a low current type input buffer.

In one embodiment, the second input buffer is a Bazes type input buffer.

In one embodiment, the first input buffer includes a first differential amplifier, a first inverter, a first NMOS transistor and a first PMOS transistor. The first differential amplifier receives the external clock enable signal and the first reference voltage and generates an output signal based on a voltage difference between the external clock enable signal and the first reference voltage. The first inverter inverts the self-refresh control signal. The first NMOS transistor has a gate terminal that receives the output signal of the first inverter, a drain terminal connected to the first differential amplifier and a source terminal connected to a ground voltage. The first PMOS transistor has a gate terminal that receives the output signal of the first inverter, a source terminal connected to a power supply voltage and a drain terminal connected to a output terminal of the first differential amplifier.

The second input buffer can include a first differential amplifier, a first inverter, a first PMOS transistor and a first NMOS transistor. The first differential amplifier receives the external clock enable signal and the second reference voltage and generates an output signal based on a voltage difference between the external clock enable signal and the second reference voltage. The first inverter inverts the delayed self-refresh control signal. The first PMOS transistor has a gate terminal that receives the output signal from the first inverter, a drain terminal connected to the first differential amplifier and a source terminal connected to the power supply voltage. The first NMOS transistor has a gate terminal that receives the output signal from the first inverter, a source terminal connected to the ground voltage and a drain terminal connected to a output terminal of the first differential amplifier.

The first differential amplifier can include a second PMOS transistor, a third PMOS transistor, a fourth PMOS transistor, a second NMOS transistor, a third NMOS transistor and a fourth NMOS transistor. The second PMOS transistor has a source terminal connected to the drain terminal of the first PMOS transistor and a gate terminal connected to a first node. The third PMOS transistor has a source terminal connected to the drain terminal of the second PMOS transistor, a gate terminal to which the external clock enable signal is supplied, and a drain terminal connected to the first node. The fourth PMOS transistor has a source terminal connected to the drain terminal of the second PMOS transistor and a gate terminal to which the second reference voltage is supplied. The second NMOS transistor has a drain terminal connected to the first node and a gate terminal to which the external clock enable signal is supplied. The third NMOS transistor has a drain terminal connected to the drain terminal of the fourth PMOS transistor and a gate terminal to which the second reference voltage is supplied. The fourth NMOS transistor has a drain terminal commonly connected to the source terminals of the second NMOS transistor and the third NMOS transistor, a gate terminal connected to the first node and a source terminal to which the ground voltage is supplied, wherein an output signal of the first differential amplifier is output from the drain terminal of the third PMOS transistor.

Other aspects, features and advantages of the present invention are described in the detailed description that follows.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS

The input buffer circuit of the synchronous semiconductor memory device according to the present invention will now be described with reference to the accompanying drawings.

Figure 1:
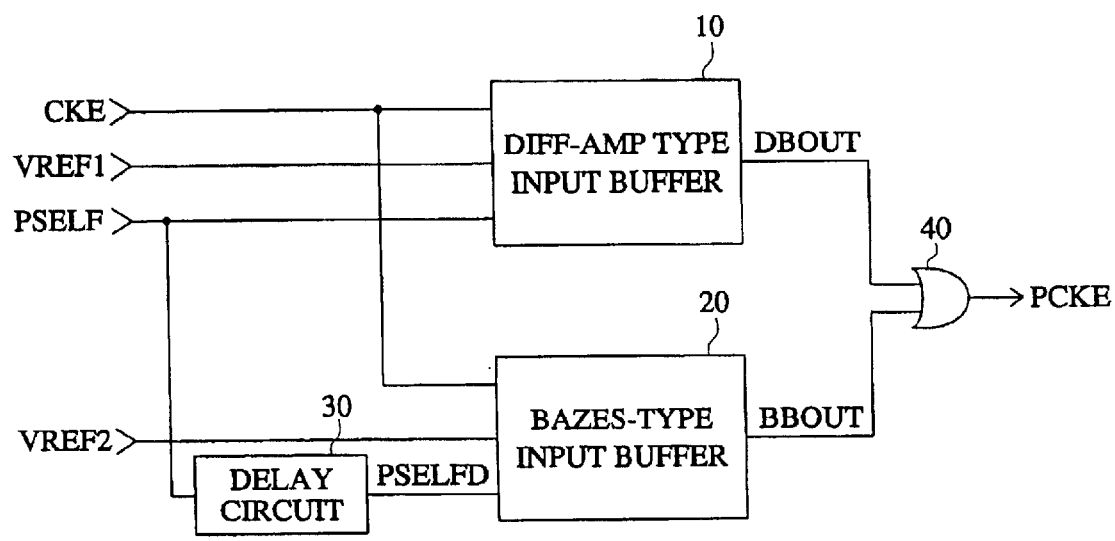
FIG. 1 contains a circuit diagram of the input buffer circuit in which the differential amplifier type input buffer is connected in parallel with a Bazes type input buffer, according to the present invention.

FIG. 1 shows a circuit diagram of an input buffer circuit having a differential amplifier type input buffer and a Bazes type input buffer, according to the present invention.

As shown in FIG. 1, the input buffer circuit comprises: (i) a differential amplifier type input buffer 10 that receives and amplifies an external clock enable signal CKE, a reference voltage VREF1, and a self-refresh control signal PSELF to generate an output signal DBOUT, (ii) a delay circuit 30 that receives the self-refresh control signal PSELF to output the delayed self-refresh control signal PSELFD, (iii) a Bazes type input buffer 20 that receives and amplifies the external clock enable signal CKE, a reference voltage VREF2, and the delayed self-refresh control signal PSELFD to generate an output signal BBOUT, and (iv) an OR gate circuit 40 that receives the output signal DBOUT of the differential amplifier type input buffer 10 and the output signal BBOUT of the Bazes type input buffer 20, performs an OR operation on the output signals and generates the internal clock enable signal PCKE.

Figure 2:
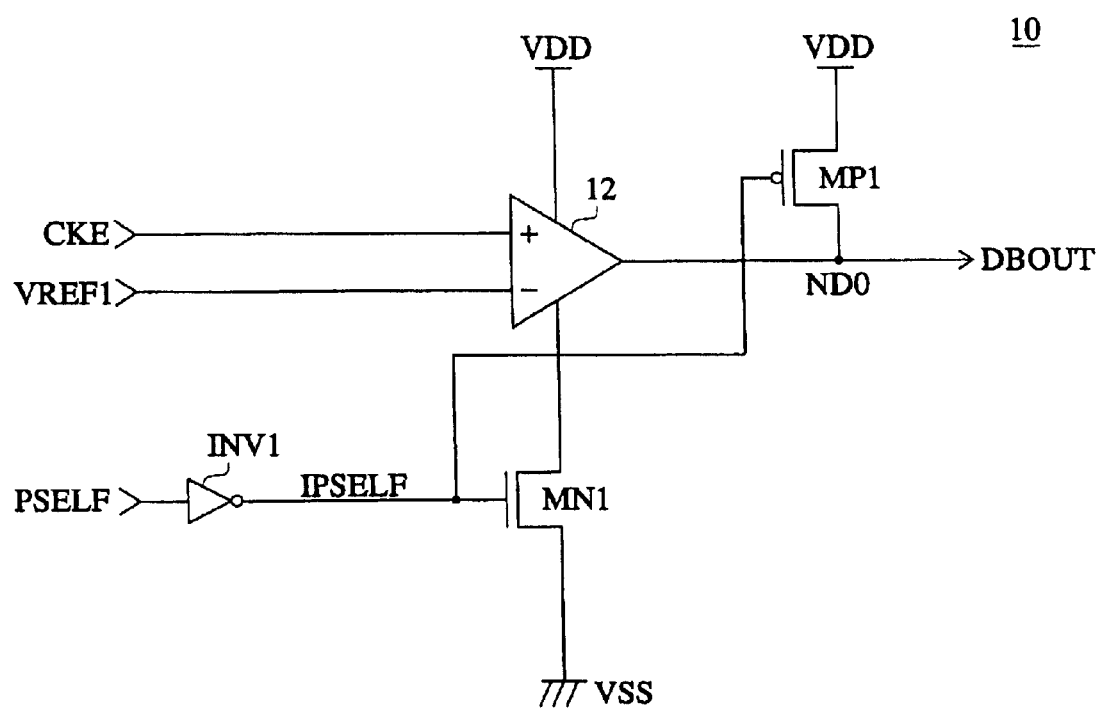
FIG. 2 contains a circuit diagram of the differential amplifier type input buffer according to a first embodiment of FIG. 1.

FIG. 2 shows a circuit diagram of the differential amplifier type input buffer 10 according to a first embodiment of FIG. 1.

As shown in FIG. 2, the differential amplifier type input buffer 10 comprises: (i) a differential amplifier 12 that receives the external clock enable signal CKE and the reference voltage VREF1 and generates an output signal DBOUT based on a voltage difference between the external clock enable signal CKE and the first reference voltage VREF1, (ii) an inverter INV1 for inverting the received self-refresh control signal PSELF, (iii) an NMOS transistor MN1 having a gate terminal that receives the output signal IPSELF of the inverter INV1, a drain terminal connected to the differential amplifier 12 and a source terminal connected to a ground voltage VSS, and (iv) a PMOS transistor MP1 having a gate terminal that receives the output signal IPSELF of the inverter INV1, a source terminal connected to a power supply VDD and a drain terminal connected to an output node ND0 of the first differential amplifier 12.

Figure 3:
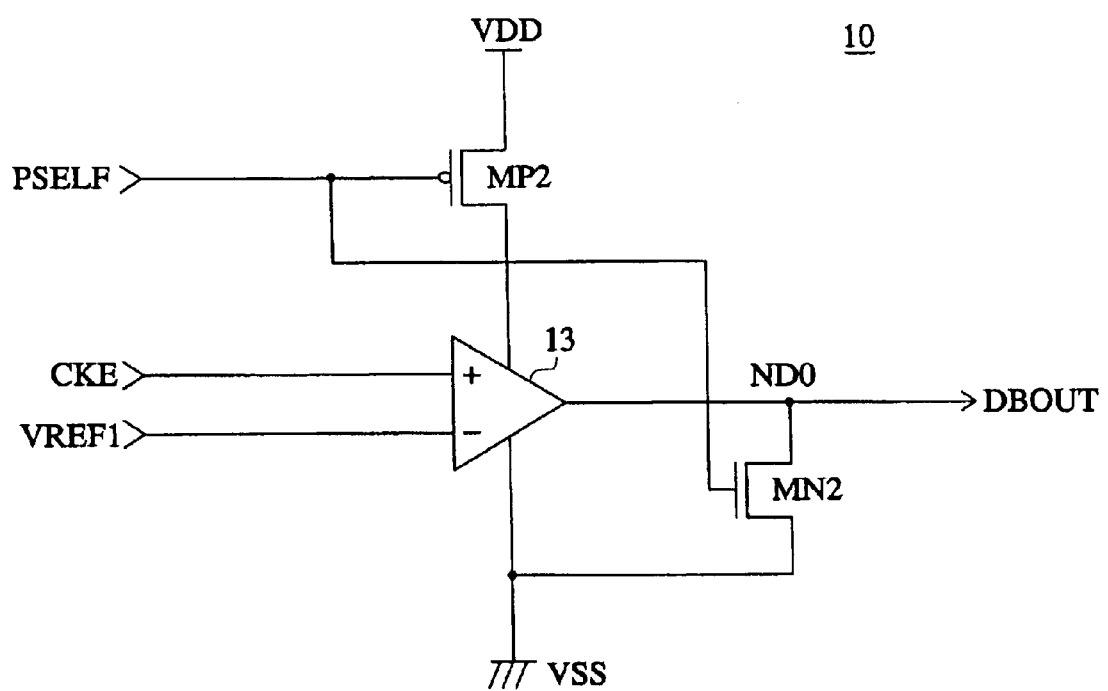
FIG. 3 contains a circuit diagram of the differential amplifier type input buffer according to a second embodiment of FIG. 1.

FIG. 3 shows a circuit diagram of the differential amplifier type input buffer 10 according to a second embodiment of FIG. 1.

Referring now to the FIG. 3, the differential amplifier type input buffer comprises: (i) a differential amplifier 13 that receives the external clock enable signal CKE and the reference voltage VREF1 and generates an output signal DBOUT based on a voltage difference between the external clock enable signal CKE and the reference voltage VREF1, (ii) a PMOS transistor MP2 having a gate terminal that receives the self-refresh control signal PSELF, a drain terminal connected to the differential amplifier 13 and a source terminal connected to a power supply voltage VDD, and (iii) an NMOS transistor MN2 having a gate terminal that receives the self-refresh control signal PSELF, a source terminal connected to the ground voltage VSS and a drain terminal connected to the output node ND0 of the second differential amplifier 13.

Figure 4:
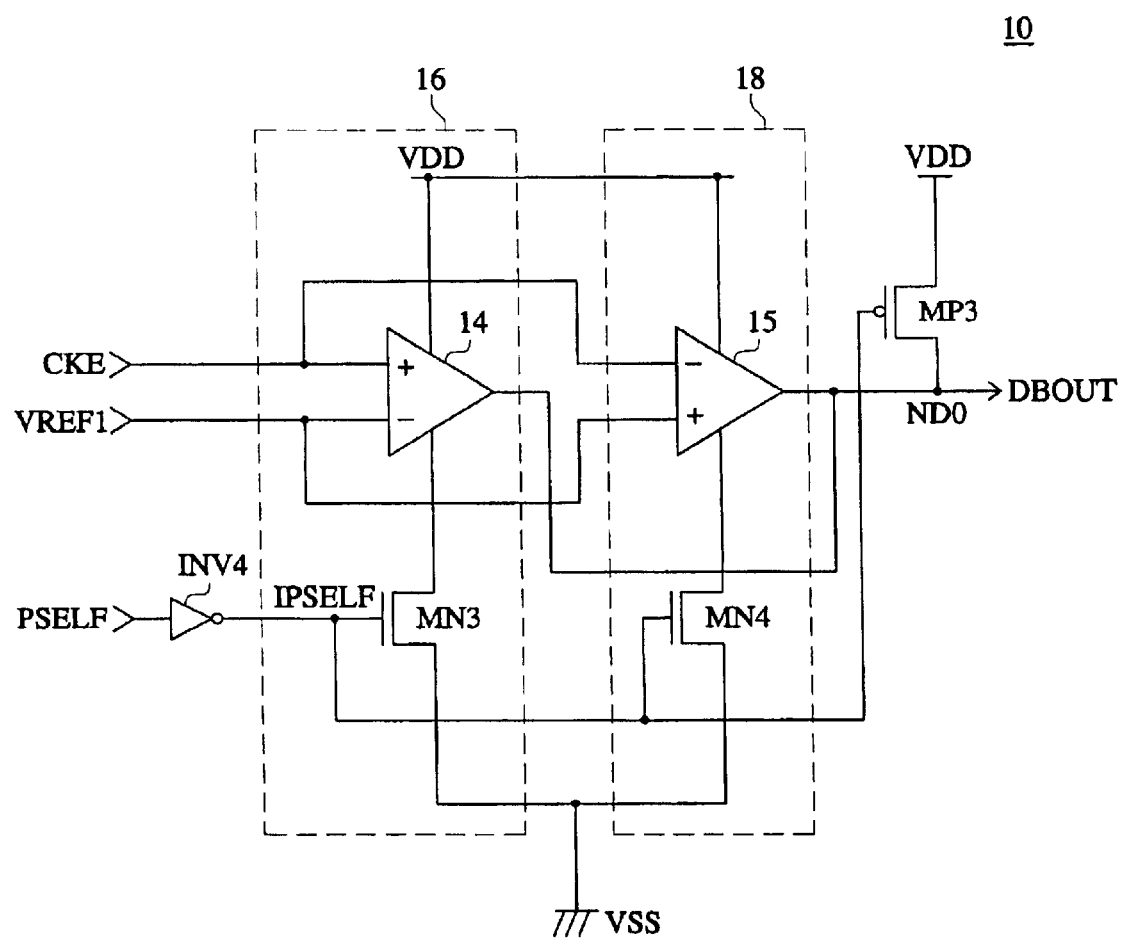
FIG. 4 contains a circuit diagram of the differential amplifier type input buffer according to a third embodiment of FIG. 1.

FIG. 4 shows a circuit diagram of the differential amplifier type input buffer 10 according to a third embodiment of FIG. 1.

As shown in FIG. 4, the differential amplifier type input buffer is configured to have two differential amplifier type input buffers 14 and 15. The differential amplifier type input buffer 10 of FIG. 4 comprises: (i) a differential amplifier 14 that receives the external clock enable signal CKE and the reference voltage VREF1 and generates an output signal DBOUT at the output node ND0 of the amplifier 14, based on a voltage difference between the external clock enable signal CKE and the first reference voltage VREF1, (ii) an inverter INV4 for inverting the received self-refresh control signal PSELF, (iii) an NMOS transistor MN3 having a gate terminal that receives the output signal IPSELF of the inverter INV4, a drain terminal connected to the differential amplifier 14 and a source terminal connected to the ground voltage VSS, (iv) a differential amplifier 15 that receives the external clock enable signal CKE and the reference voltage VREF1 and generates an output signal DBOUT at the output node ND0 of the amplifier 15, based on a voltage difference between the external clock enable signal CKE and the first reference voltage VREF1, (v) an NMOS transistor MN4 having a gate terminal that receives the output signal IPSELF of the inverter INV4, a drain terminal connected to the differential amplifier 15 and a source terminal connected to the ground voltage VSS, and (vi) a PMOS transistor MP3 having a gate terminal that receives the output signal IPSELF of the inverter INV4, a source terminal connected to the power supply VDD and a drain terminal connected to an output node ND0 of the first differential amplifier 15.

Figure 5:
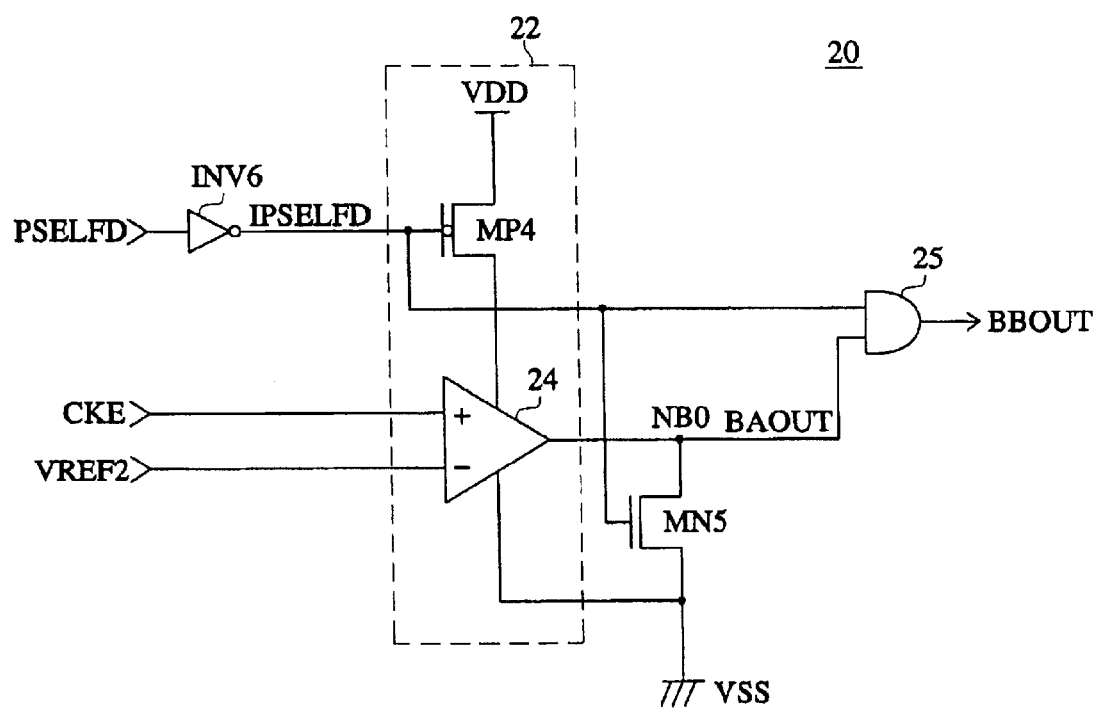
FIG. 5 contains a circuit diagram of the Bazes type input buffer of FIG. 1.

FIG. 5 show a circuit diagram of the Bazes type input buffer 20 of FIG. 1.

Referring now to FIG. 5, the Bazes type input buffer 20 comprises: (i) a differential amplifier 24 that receives the external clock enable signal CKE and the reference voltage VREF2, and generates an output signal BAOUT at the output node NB0 of the amplifier 24, based on a voltage difference between the external clock enable signal CKE and the reference voltage VREF2, (ii) an inverter INV6 for inverting the received self-refresh control signal PSELFD, (iii) a PMOS transistor MP4 having a gate terminal that receives the output signal IPSELFD of the inverter INV6, a drain terminal connected to an output node ND0 of the first differential amplifier 24, and a source terminal connected to the power supply VDD, (iv) an NMOS transistor MN5 having a gate terminal that receives the output signal IPSELFD of the inverter INV6, a drain terminal connected to the output node NB0 of the differential amplifier 24 and a source terminal connected to the ground voltage VSS, and (v) an AND circuit 25 that receives the output signal IPSELFD of the inverter INV6 and the output signal BAOUT of the differential amplifier 24, and performs an AND operation on both output signals and generates the output signal BBOUT.

Figure 6:
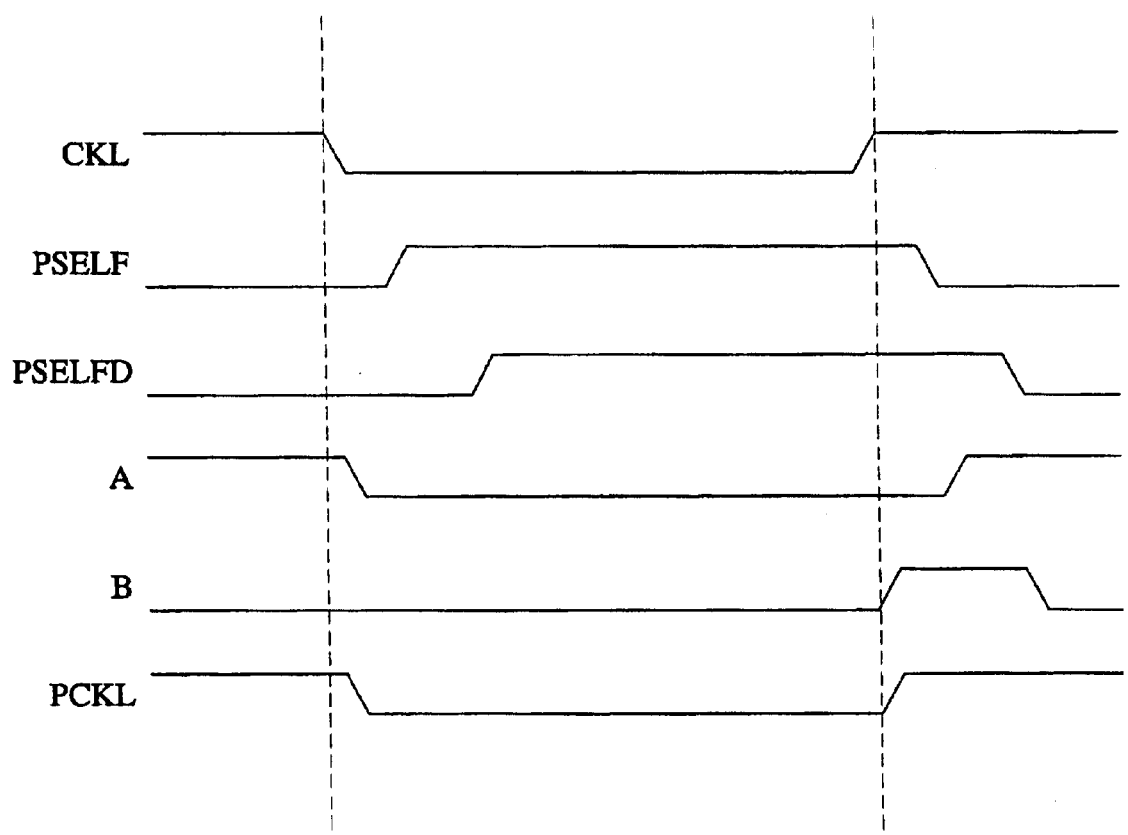
FIG. 6 is a timing chart representing a signal waveform illustrating the operation of the input buffer of FIG. 1, according to the present invention.

FIG. 6 is a timing chart representing a signal waveform for describing the operation of the input buffer of FIG. 1, according to the present invention.

Next, the input buffer according to the present invention will be described with reference to FIG. 1 to FIG. 6.

The differential amplifier used in the differential amplifier type input buffer circuit 10 is a common differential amplifier. The differential amplifier used in the Bazes type input buffer is a low current differential amplifier. When the input buffer of the present invention is placed in the normal mode, the self-refresh control signal PSELF and the delayed self-refresh control signal PSELFD are at both "Low" states. At this time, the NMOS transistor MN1 as shown in FIG. 2 is turned on and, thus, the differential amplifier 12 of the differential amplifier type input buffer 10 is also turned on. Accordingly, the PMOS transistor MP4 as shown in FIG. 5 is turned off, and the differential amplifier 24 of the Bazes type input buffer 20 is turned off. When the external clock enable signal CKE becomes low, the output node ND0 of the differential amplifier 12 becomes low and, thus, the output signal DBOUT of the differential amplifier type input buffer 10 becomes low. Accordingly, the internal clock enable signal PCKE becomes low, and the semiconductor memory device enters the self-refresh mode. Then, the self-refresh control signal PSELF enters the "high" state and the differential amplifier of the differential amplifier type input buffer 10 turns off. After a predetermined delay time, when the delayed self-refresh control signal PSELFD becomes high, the differential amplifier 24 of the Bazes type input buffer 20 as shown to FIG. 5 turns on. When the self-refresh control signal PSELF is high, and the delayed self-refresh control signal PSELFD is low, the differential amplifiers 12 and 24 turn off, but the output signal DBOUT of the differential amplifier type input buffer 10 and the output signal BAOUT of the differential amplifier 24 of the Bazes type input buffer 20 are low, corresponding to an initial value of the differential amplifier 12 and 24. Accordingly, the internal clock enable signal PCKE remains in a low state. When the external clock enable signal CKE become high, the internal clock enable signal PCKE and the output signal BAOUT of the differential amplifier 24 of the Bazes type input buffer 20 are all high. Accordingly, the semiconductor memory device exits the self-refresh mode. Also, when the external clock enable signal CKE returns to high, the self-refresh control signal PSELF becomes low and, thus, the differential amplifier 12 of the differential amplifier type input buffer 10 turns on. After a predetermined delay time, when the delayed self-refresh control signal PSELFD becomes low, the differential amplifier 24 of the Bazes type input buffer 20 turns off.

The differential amplifier type input buffer as shown to FIG. 3 operates in the same manner described above in reference to the differential amplifier type input buffer as shown in FIG. 2, except that the differential amplifier 13 turns on in response to the operation of the PMOS transistor MP2, and the output node ND0 of the differential amplifier 13 is reset by the NMOS transistor MN2.

The differential amplifier type input buffer as shown in FIG. 4 operates in the same manner as the differential amplifier type input buffer as shown in FIG. 2, except that the input buffer of FIG. 4 includes two amplification stages 16 and 18.

Figure 7:
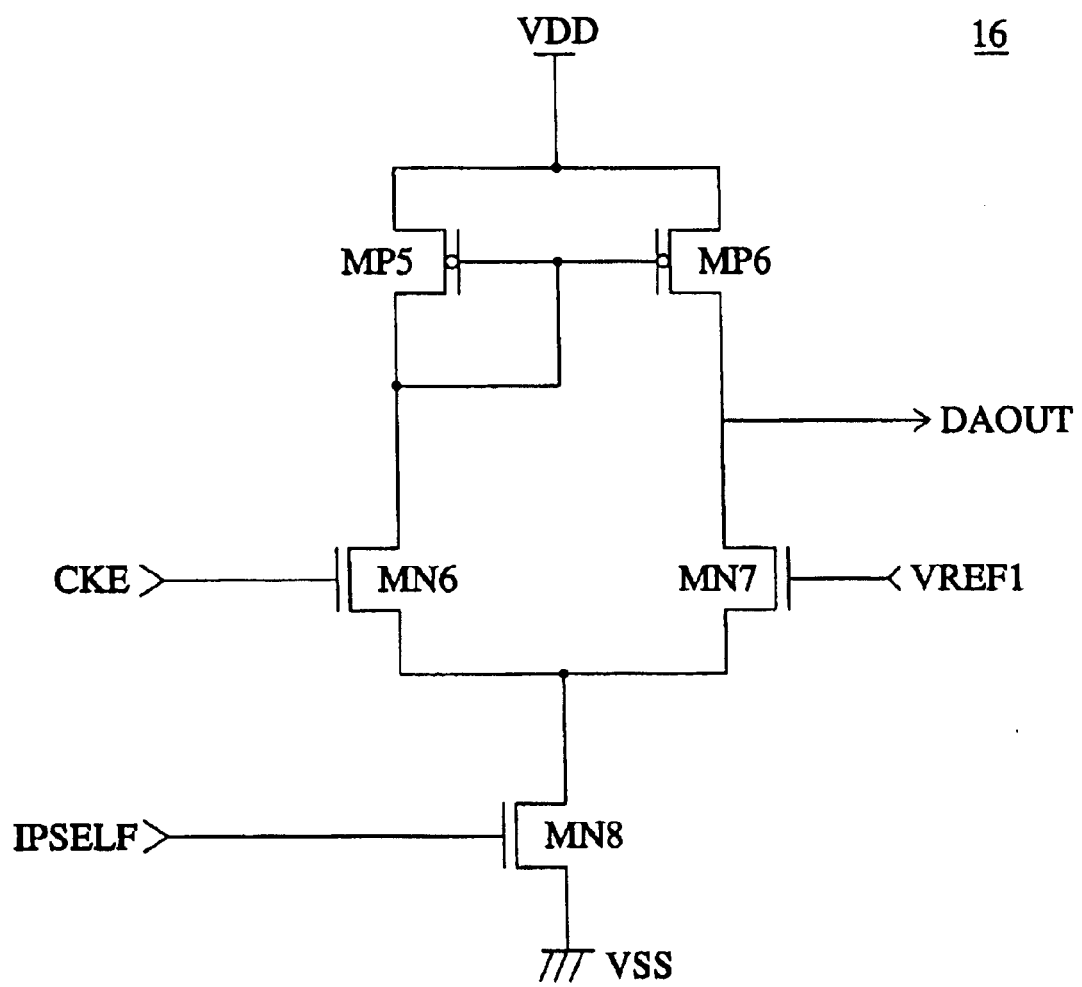
FIG. 7 contains a detailed circuit diagram of a first amplification stage of the differential amplifier type input buffer of FIG. 4.

FIG. 7 shows a detailed circuit diagram of the first amplification stage 16 of the differential amplifier type input buffer of FIG. 4. The first amplification stage comprises: (i) the PMOS transistor MP5 having a source terminal connected to the power supply voltage VDD, and a gate terminal and a drain terminal commonly connected to each other, (ii) the PMOS transistor MP6 having a source terminal connected to the power supply voltage VDD and a gate terminal connected to the gate terminal of the PMOS transistor MP5, (iii) the NMOS transistor MN6 having a drain terminal connected to the drain of the PMOS transistor MP5 and a gate terminal to which the external clock enable signal CKE is supplied, (iv) the NMOS transistor MN7 having a drain terminal connected to the drain terminal of the PMOS transistor MP6 and a gate terminal connected to the first reference voltage VREF1, and (v) the NMOS transistor MN8 having a drain terminal commonly connected to the source terminal of the NMOS transistor MN6 and the NMOS transistor MN7, a gate terminal to which the inverted self-refresh control signal IPSELF is supplied and a source terminal connected to the ground voltage VSS. The output signal DAOUT of the first amplification stage 16 is output from the drain terminal of the PMOS transistor MP6.

Figure 8:
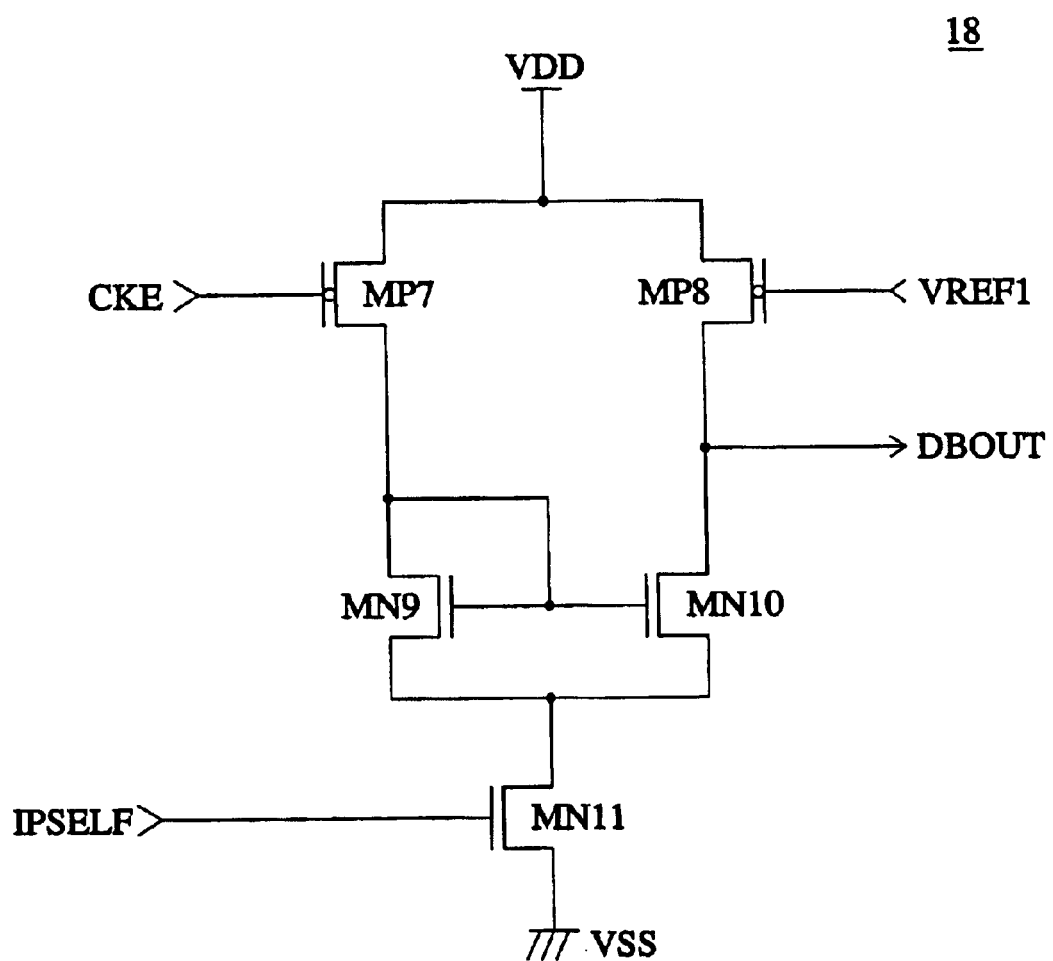
FIG. 8 contains a detailed circuit diagram of a second amplification stage of the differential amplifier type input buffer of FIG. 4.

FIG. 8 shows a detailed circuit diagram of a second amplification stage 18 of the differential amplifier type input buffer of FIG. 4. The second amplification stage 18 comprises: (i) the PMOS transistor MP7 having a source terminal connected to the power voltage VDD and a gate terminal to which the external clock enable signal CKE is supplied, (ii) the PMOS transistor MP8 having a source terminal connected to the power supply voltage VDD and a gate terminal to which the first reference voltage VREF1 is supplied, (iii) the NMOS transistor MN9 having a drain terminal connected to the drain of the PMOS transistor MP7 and a gate terminal and a drain terminal connected to each other, (iv) the NMOS transistor MN10 having a drain terminal connected to the drain terminal of the PMOS transistor MP8 and a gate terminal connected to the gate terminal of the NMOS transistor MN9, and (v) the NMOS transistor MN11 having a drain terminal commonly connected to the source terminals of the NMOS transistor MN9 and the NMOS transistor MN10, a gate terminal to which the inverted self-refresh control signal IPSELF is supplied, and a source terminal connected to the ground voltage VSS, wherein the output signal DBOUT of the second amplification stage 18 is output from the drain terminal of the PMOS transistor MP8.

Hereinafter, the operation of the first and second amplification stages 16 and 18 shown in FIG. 7 and FIG. 8 will be described in more detail. When the external clock enable signal CKE is greater than the first reference voltage VREF1, the output signal of the first and second amplification stages 16 and 18 become high. When the external clock enable signal CKE is less than the first reference voltage VREF1, the output signal of the first and second amplification stages 16 and 18 become "low. When the inverted self-refresh control signal IPSELF is at high, the NMOS transistors MN8 and MN11 are turned on and, thus, the first and second amplification states 16 and 18 become on. When the inverted self-refresh control signal IPSELF is low, the NMOS transistor MN8 and MN11 are turned off and, thus, the first and second stages 16 and 18 are off.

Figure 9:
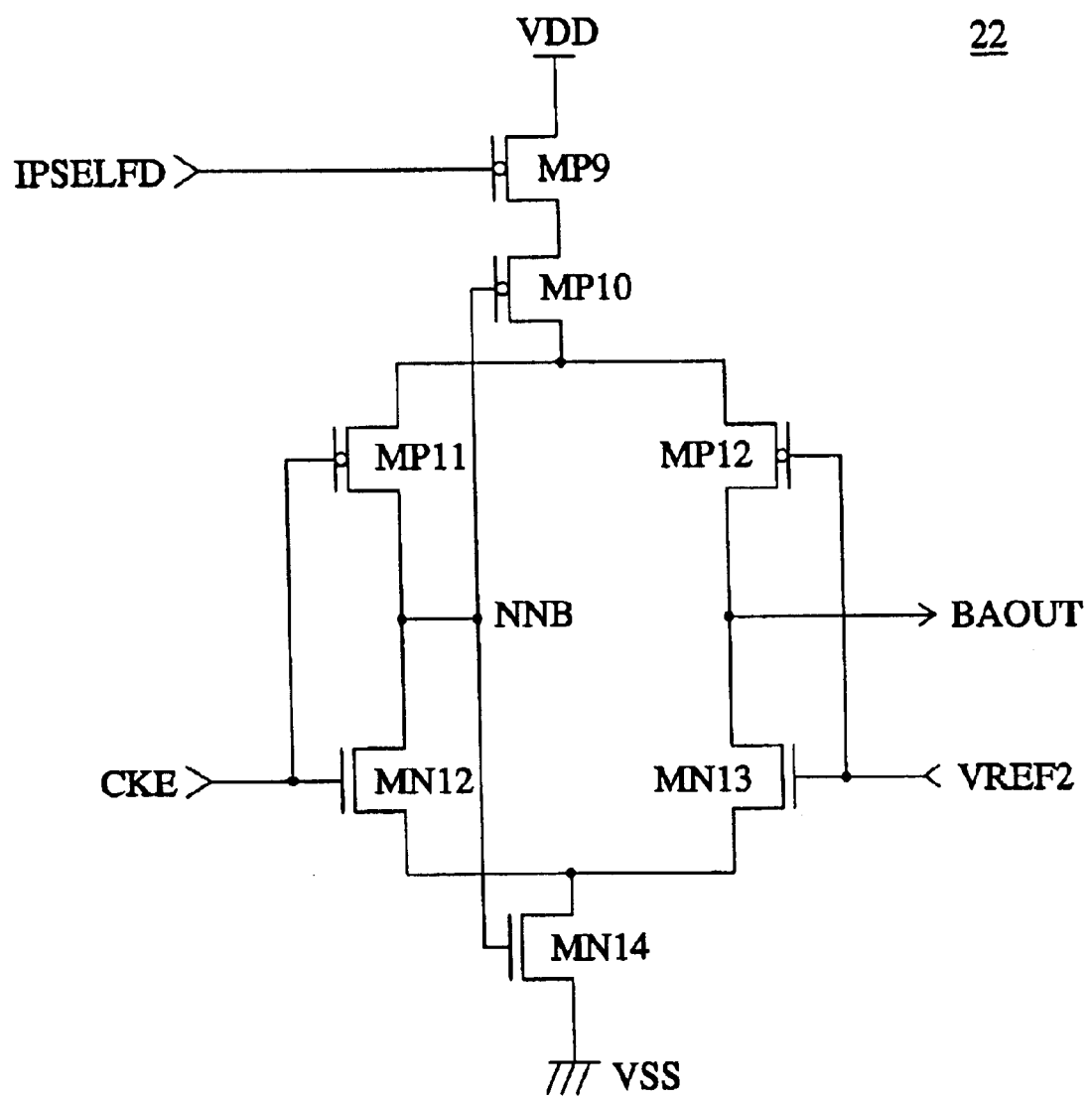
FIG. 9 contains a detailed circuit diagram of an amplification stage of the Bazes type input buffer of FIG. 5.

FIG. 9 shows a detailed circuit diagram of the amplification stage 22 of the Bazes type input buffer of FIG. 5. The first amplification stage 22 comprises: (i) the PMOS transistor MP9 having a drain terminal connected to the power supply voltage VDD and a gate terminal to which the inverted delayed self-refresh control signal IPSELFD is supplied, (ii) the PMOS transistor MP10 having a source terminal connected to the drain terminal of the PMOS transistor MP9 and a gate terminal connected to a node NNB, (iii) the PMOS transistor MP11 having a source terminal connected to the drain of the PMOS transistor MP10, a gate terminal to which the external clock enable signal CKE is supplied, and a drain terminal connected to the node NNB, (iv) the PMOS transistor MP12 having a source terminal connected to the drain terminal of the PMOS transistor MP10 and a gate terminal connected to the second reference voltage VREF2, (v) the NMOS transistor MN12 having a drain terminal connected to the node NNB and a gate terminal to which the external clock enable signal CKE is supplied, (vi) the NMOS transistor MN13 having a drain terminal connected to the drain of the PMOS transistor MP12 and a gate terminal to which the second reference voltage VREF2 is supplied, and (vii) the NMOS transistor MN14 having a drain terminal commonly connected to the source terminals of the NMOS transistor MN12 and the NMOS transistor MN13, a gate terminal connected to the node NNB, and a source terminal connected to the ground voltage VSS. The output signal BAOUT of the amplification stage 22 is output from the drain terminal of the PMOS transistor MP12.

Hereinafter, the operation of the amplification stage 22 shown in FIG. 9 is described in more detail. When the external clock enable signal CKE is greater than the second reference voltage VREF2, output signal BAOUT of the amplification stage 22 becomes high. When the external clock enable signal CKE is less than the second reference voltage VREF2, the output signal BAOUT of the amplification stage 22 becomes low. When the amplification stage 22 of the Bazes type input buffer shown in FIG. 9 is on, the current flowing through the amplification stage 22 is very small. Accordingly, the present invention can reduce the current consumption by using the amplification stage 22 of the Bazes type input buffer in the self-refresh mode.

Figure 10A:
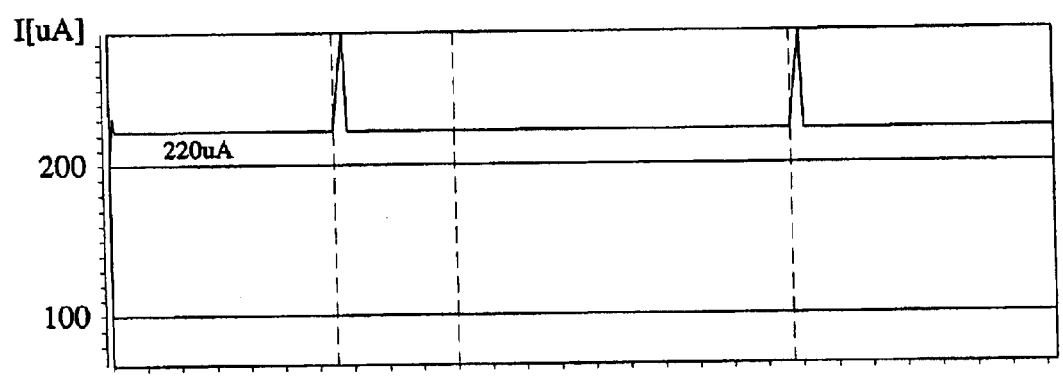
FIG. 10a illustrates a signal waveform representing the results of a simulation depending on the changes in the current flowing into a conventional input buffer.
Figure 10B:
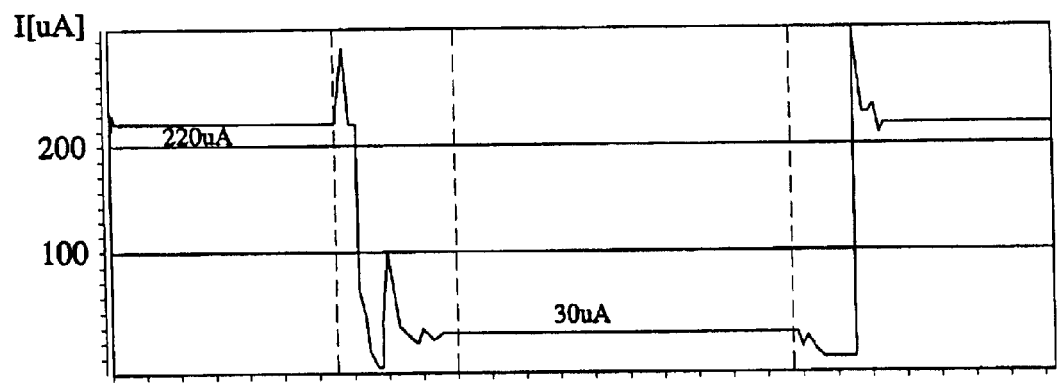
FIG. 10b illustrates a signal waveform representing the results of a simulation depending on the changes in the current flowing into the input buffer of the present invention.

FIG. 10a shows a signal waveform representing the results of a simulation depending on the changes in the current flowing into a conventional input buffer, and FIG. 10b shows a signal waveform representing the results of a simulation depending on the changes in the current flowing into the input buffer of the present invention. According to the input buffer of the conventional synchronous semiconductor memory device, the current in the self-refresh mode is the same (200 μA as result of the simulation) as that in the normal mode, because the conventional synchronous semiconductor memory device used the differential amplifier type input buffer in the self-refresh mode as in the normal mode. However, according to the input buffer circuit of the present invention, the differential amplifier type input buffer is used in the normal mode and the Bazes type input buffer is used in the self-refresh mode. As a result, a current (30 μA as result of the simulation) flowing through the input buffer in the self-refresh mode is much less than the current (200 μA as result of the simulation) flowing through the input buffer circuit in the normal mode.

As described above, according to the input buffer circuit of the synchronous semiconductor memory device of the present invention, the current flowing through the input buffer in the self-refresh mode is very small. Therefore, the power consumption of the synchronous semiconductor memory device can be reduced.

While the invention has been particularly shown and described with reference to preferred embodiments thereof, it will be understood by those skilled in the art that the foregoing and other changes in form and details may be made therein without departing from the spirit and scope of the invention.

What is claimed is:

1. An input buffer circuit of a synchronous semiconductor memory device comprising a differential amplifier type input buffer and a low current type input buffer, wherein the differential amplifier type input buffer is operated in a normal mode, and the low current type input buffer is operated in a self-refresh mode, thereby reducing the current flowing through the input buffer in the self-refresh mode.

2. An input buffer of a synchronous semiconductor memory device, comprising:
   a first input buffer circuit that receives an external clock enable signal and a self-refresh control signal to amplify a voltage difference between the received external clock enable signal and a first reference voltage;
   a delay circuit that receives the self-refresh control signal to output a delayed self-refresh control signal;
   a second input buffer that receives the external clock enable signal and the delayed self-refresh control signal to amplify a voltage difference between the received external clock enable signal and a second reference voltage; and
   an OR circuit that receives the output signal of the first input buffer and the output signal of the second input buffer and then performs an OR operation to output an internal clock enable signal, wherein the first input buffer is operated in the normal mode and the second input buffer is operated in the self-refresh mode to thereby reduce the current flowing into the input buffer in the self-refresh mode, and wherein the first input buffer is a differential amplifier type input buffer and the second input buffer is a low current type input buffer.

3. The input buffer circuit according to claim 2, wherein the second input buffer is a Bazes type input buffer.

4. The input buffer circuit according to claim 2, wherein the first input buffer comprises:
   a first differential amplifier that receives the external clock enable signal and the first reference voltage and generates an output signal based on a voltage difference between the external clock enable signal and the first reference voltage;
   a first inverter for inverting the self-refresh control signal;
   a first NMOS transistor having a gate terminal that receives the output signal of the first inverter, a drain terminal connected to the first differential amplifier and a source terminal connected to a ground voltage; and a first PMOS transistor having a gate terminal that receives the output signal of the first inverter, a source terminal connected to a power supply voltage and a drain terminal connected to an output terminal of the first differential amplifier.

5. The input buffer circuit according to claim 2, wherein the first input buffer comprises:

a first differential amplifier that receives the external clock enable signal and the first reference voltage and generates an output signal based on a voltage difference between the external clock enable signal and the first reference voltage;

a first PMOS transistor having a gate terminal that receives the external clock signal, a drain terminal connected to the first differential amplifier and a source terminal connected to the power supply voltage; and a first NMOS transistor having a gate terminal that receives the external clock enable signal, a source terminal connected to the ground voltage and a drain terminal connected to the output terminal of the first differential amplifier.

6. The input buffer circuit according to claim 2, wherein the second input buffer comprises:

a first differential amplifier that receives the external clock enable signal and the second reference voltage and generates an output signal based on a voltage difference between the external clock enable signal and the second reference voltage;

a first inverter for inverting the delayed self-refresh control signal;

a first PMOS transistor having a gate terminal that receives the output signal from the first inverter, a drain terminal connected to the first differential amplifier and a source terminal connected to a power supply voltage; and a first NMOS transistor having a gate terminal that receives the output signal from the first inverter, a source terminal connected to the ground voltage and a drain terminal connected to an output terminal of the first differential amplifier.

7. The input buffer circuit according to claim 6, wherein the first differential amplifier, comprises:

a second PMOS transistor having a source terminal connected to the drain terminal of the first PMOS transistor and a gate terminal connected to a first node;

a third PMOS transistor having a source terminal connected to the drain terminal of the second PMOS transistor, a gate terminal to which the external clock enable signal is supplied, and a drain terminal connected to the first node;

a fourth PMOS transistor having a source terminal connected to the drain terminal of the second PMOS transistor and a gate terminal to which the second reference voltage is supplied;

a second NMOS transistor having a drain terminal connected to the first node and a gate terminal to which the external clock enable signal is supplied;

a third NMOS transistor having a drain terminal connected to the drain terminal of the fourth PMOS transistor and a gate terminal to which the second reference voltage is supplied; and a fourth NMOS transistor having a drain terminal commonly connected to the source terminals of the second NMOS transistor and the third NMOS transistor, a gate terminal connected to the first node and a source terminal to which the ground voltage is supplied, wherein an output signal of the first differential amplifier is output from the drain terminal of the third PMOS transistor.

* * * * *